(12) United States Patent
Takagi

(10) Patent No.: US 6,509,633 B1
(45) Date of Patent: Jan. 21, 2003

(54) IC PACKAGE CAPABLE OF ACCOMMODATING DISCRETE DEVICES

(75) Inventor: Hideki Takagi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/545,409

(22) Filed: Apr. 7, 2000

(30) Foreign Application Priority Data

Oct. 6, 1999 (JP) ............................................. 11-285262

(51) Int. Cl.[7] .............................................. H01L 23/02
(52) U.S. Cl. ...................... 257/678; 257/686; 257/700; 257/710; 257/724
(58) Field of Search .................. 257/678, 723, 257/724, 725, 712, 730, 253, 710, 532, 924, 691, 685, 686, 700; 438/107, 108, 109; 361/301.1

(56) References Cited

U.S. PATENT DOCUMENTS 5,831,810 A * 11/1998 Bird et al. ............... 361/301.1

* cited by examiner

Primary Examiner—Phat X. Cao
Assistant Examiner—Theresa T. Doan
(74) Attorney, Agent, or Firm—Rabin & Berdo, P.C.

(57) ABSTRACT

An IC (Integrated Circuit) package includes a package body having a cavity formed for receiving an IC chip therein. A terrace protrudes from at least part of the edges defining the cavity into the cavity. Discrete devices can be mounted on the terrace, i.e., inside the IC package. With this configuration, the IC package insures the stable operation of a high-frequency IC circuit.

20 Claims, 2 Drawing Sheets

IC PACKAGE CAPABLE OF ACCOMMODATING DISCRETE DEVICES

BACKGROUND OF THE INVENTION

1. Field of the Invention

The present invention relates to an IC (Integrated Circuit) package loaded with a semiconductor IC chip, particularly an IC chip for high-frequency applications, in a cavity formed therein.

2. Description of the Background Art

A package sealed with resin or a package implemented by a laminate of ceramic layers has customarily been used to densely mount high-frequency semiconductor IC chips on, e.g., a printed circuit board. For example, the IC: package with the ceramic layers (ceramic package hereinafter) has a laminate of a first, a second and a third ceramic layer, as named from the top to the bottom. A cavity is formed at the center of the package throughout the first and second ceramic layers to a certain depth. The cavity has an optimal seize designed in accordance with the size and shape of a high-frequency semiconductor IC chip to be received therein as well as mechanical accuracy required of the assembly of the IC chip. Thirteen lead terminals extend out from each of four sides of the package.

A wiring pattern and a grounding conductor pattern are formed by screen printing in a pattern wiring zone defined on the upper surface of the first ceramic layer. Bonding pads are formed on the first ceramic layer around the cavity and connected to connector electrodes of the IC chip by bonding wires. A ground terminal layer is printed on the upper surface of the second ceramic layer and connected to, the grounding conductor pattern of the first ceramic layer by via holes. A frame is formed on the upper surface of the first ceramic layer. A ceramic cap has been positioned on the frame 9, and thereafter the entire assembly including the IC chip, pattern wiring zone and bonding wires is sealed with, e.g., glass in order to hermetically seal the ceramic package.

The problem with the above conventional ceramic package is that the cavity or space is sized to accommodate only the IC chip. Assume that the control signal lines of the IC chip mounted on the package must have their impedance matched or have their time constant adjusted or that the bypass capacitor of a power supply must be adjusted. Then, resistors, capacitors or similar discrete circuit components or: parts for such adjustment are arranged outside of the package due to the limited space available with the cavity.

However, when the above discrete parts for adjustment are arranged outside of the package, die bonding, wire bonding and lead terminals necessary for connection bring; about parasitic impedance and thereby render the characteristic of a high-frequency circuit unstable. In addition, additional areas for mounting the discrete parts must be provided around the package, increasing the overall size of a circuit board for mounting the package.

SUMMARY OF THE INVENTION

It is therefore an object of the present invention to provide an IC package allowing discrete parts for adjustment to be mounted in the inside thereof.

An IC package in accordance with the present invention includes a package body having a cavity formed for receiving an IC chip therein. A terrace protrudes from at least part of edges defining the cavity into the cavity. Discrete devices can be mounted on the terrace, i.e., inside the IC package.

BRIEF DESCRIPTION OF THE DRAWINGS

The objects and features of the present invention will become more apparent from the consideration of the following detailed description taken in conjunction witch the accompanying drawings in which.

DESCRIPTION OF THE PREFERRED EMBODIMENT

Figure 1:
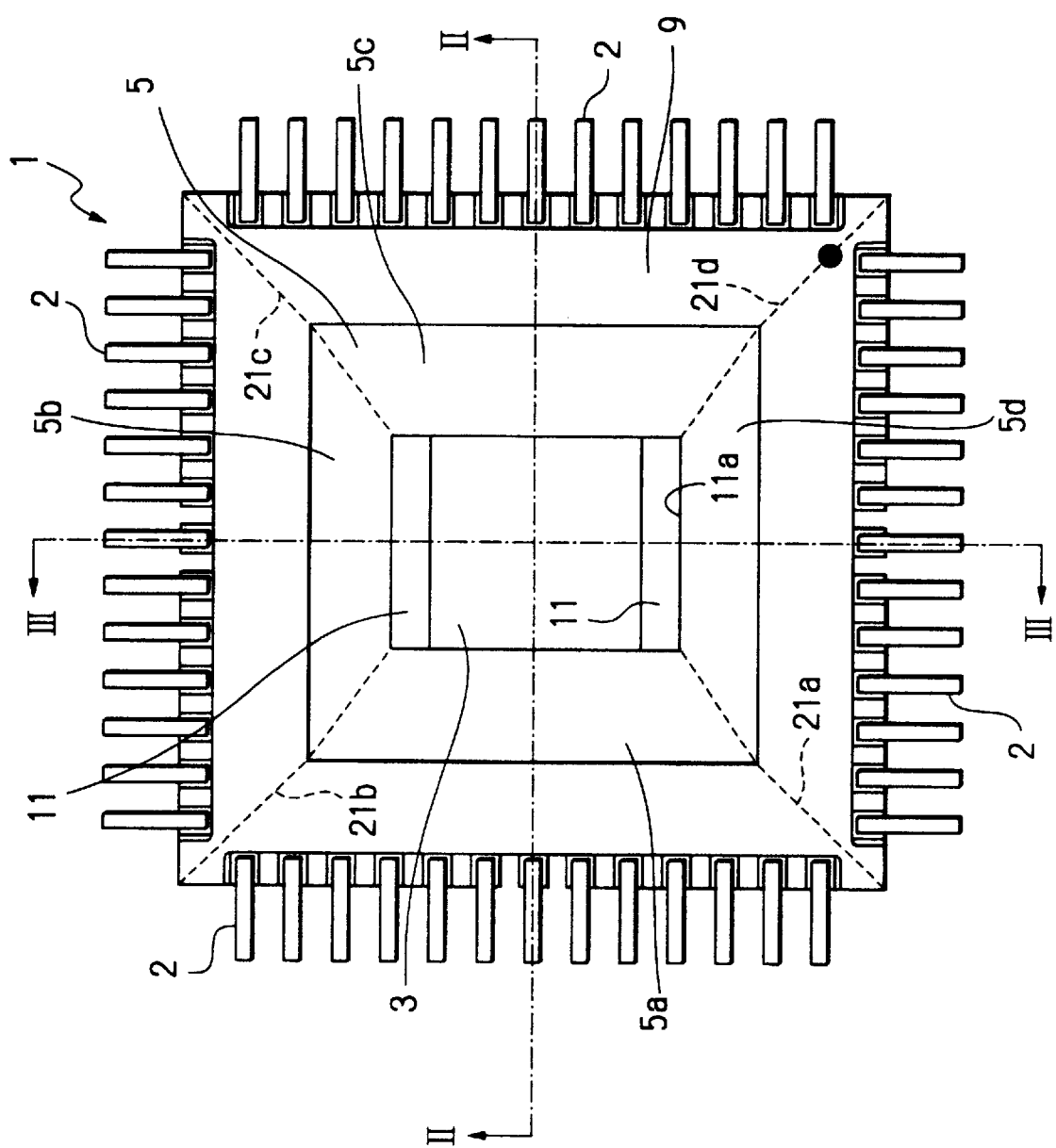
FIG. 1 is a plan view schematically showing a high-frequency IC package embodying the present invention.
Figure 2:
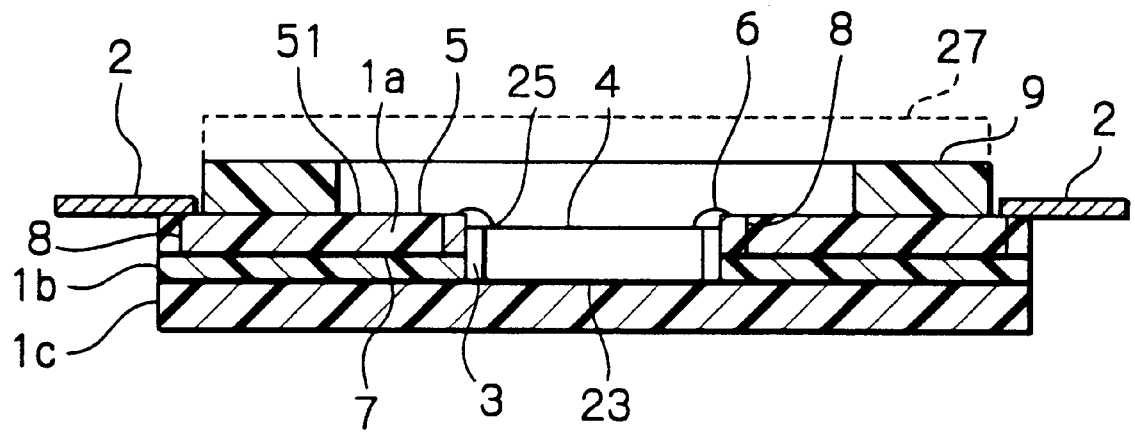
FIG. 2 is a section along line II—II of FIG. 1.
Figure 3:
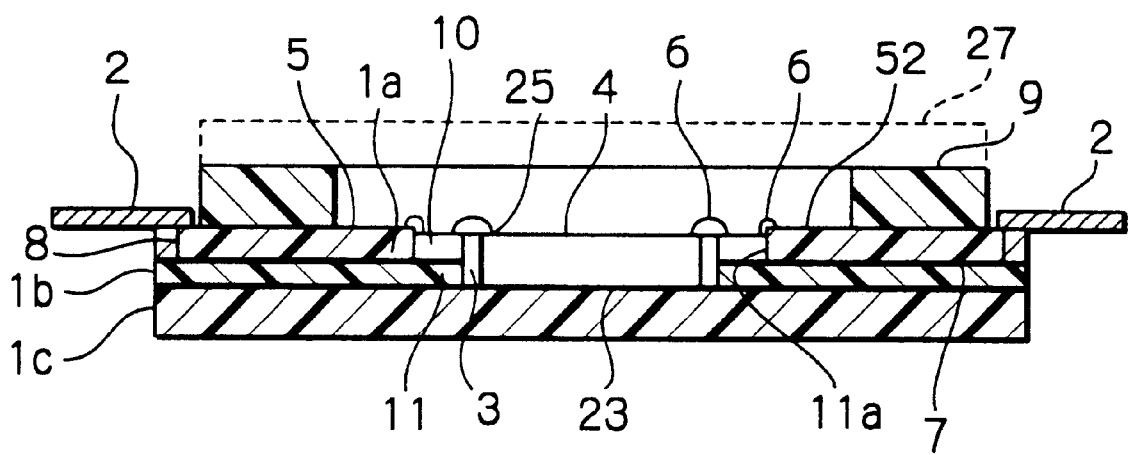
FIG. 3 is a section along line III—III of FIG. 1.

Referring to FIG. 1 of the drawings, a high-frequency IC package embodying the present invention is generally designated by the reference numeral 1. FIGS. 2 and 3 are sections along lines II—II and III—III of FIG. 1, respectively, and each shows the package 1 loaded with an IC chip 4 although not showing the internal configuration of the IC chip 4 specifically for simplicity. As shown in FIG. 1, the package 1, which is a laminate ceramic package, has a substantially square shape as seen in a plan view.

The package 1 is a laminate of generally flat layers 1a, 1b and 1c formed of a ceramic material or similar insulating material. Let the ceramic layers 1a, 1b and 1c be respectively referred to as a first, a second and a third ceramic layer, as named from the top to the bottom in FIG. 2. A cavity 3 is formed in substantially the center of the package 1 throughout the first and second ceramic layers 1a and 1b to a preselected depth, and has a generally rectangular flat configuration. The IC chip 4 is received in the cavity 3. In the illustrative embodiment, thirteen lead terminals 2 extend out from each of four sides of the package 1.

Part of the upper surface of the first ceramic layer 1a forms a pattern wiring zone 5. Conductive wiring patterns forming control signal lines meant for the IC chip 4 and conductive wiring patterns forming high-speed, or higher rate, signal lines are arranged in the pattern wiring zone 5 although not shown specifically in order to avoid complexity of illustration. In the illustrative embodiment, the above two kinds of conductive patterns each are arranged in a particular portion of the pattern wiring zone 5, as will be described specifically later. Two terraces 11 each having a desired width are formed in the cavity 3 along two parallels sides, i.e., the top side and bottom side as seen in FIG. 1. The IC chip 4 received in the cavity 3 is assumed to be a high-frequency IC chip by way of example.

As shown in FIG. 1, the wiring pattern zone 5 is divided into four trapezoidal portions 5a, 5b, 5c and 5d by imaginary lines (dotted lines) 21a, 21b, 21c and 21d that connect the corresponding corners of the inner edges and outer edges of the first ceramic layer 1a. The wiring patterns forming the high-speed signal lines are formed in the trapezoidal portions 5a and 5c facing each other in the right-and-left direction. The wiring patterns forming the control signal lines are formed in the other trapezoidal portions 5b and 5d facing each other in the up-and-down direction. In this configuration, the right and left portions 5a and 5c, as seen in FIG. 1l, of the zone 5 connect wirings assigned to high-speed signals to the lead terminals 2 arranged at the right and left sides of the package 1. Likewise, the top and bottom portions 5b and 5d, as seen in FIG. 1, connect wirings assigned to control signals to the lead terminals 2 arranged at the top and bottom sides of the package 1. High-speed signals and control, signals are therefore picked up independently of each other.

More specifically, as shown in FIG. 2, wiring patterns 51 for high-speed signals and ground lines are formed on the upper surface of the first ceramic layer 1a. As shown in FIG. 3, wiring patterns 52 for control signals are also formed on the upper surface of the ceramic layer 1a. A grounding layer or ground electrode layer 7 is formed on the entire upper surface of the second ceramic layer 1b. The third ceramic layer 1c has its entire upper surface 23 metallized. The IC chip 4 is positioned on the bottom of the cavity 3 coinciding with the center of the metallized surface of the third-ceramic layer 1c. A ceramic frame 9 is formed on the upper surface of the first ceramic layer 1a. A ceramic cap 27 indicated by a phantom line covers the top of the ceramic frame 9. In this condition, the entire laminate is sealed with, e.g., glass in order to hermetically seal the package 1.

As shown in FIG. 2, conductors 8 each are buried in a particular via hole formed in the first ceramic layer 1a and implemented by a metal paste by way of example. The conductors 8 electrically connect the wiring patterns 51 assigned to grounding and the ground layer 7 isolated from each other by the ceramic layer 1a in order to reduce impedance. Bonding pads 25 are formed on the upper surface of the ceramic layer 1a around the cavity 3. Bonding wires 6 each connect one, of the bonding pads 25 to a particular electrode of the IC chip 4.

The wirings for high-speed signals formed on the first ceramic layer 1a form coplanar lines together with the ground lines. As for a line characteristic, the coplanar lines are controlled to a particular characteristic impedance (typically 50Ω) on the basis of the width of a strip conductor, not shown, for high-speed signals, the distance between a flat ground conductor or ground line and a flat grounding conductor or ground line adjoining the right and left sides of the strip conductor on the same layer, and the distance between the strip conductor and the ground layer 7 formed on the second ceramic layer 1b underlying it, i.e., the thickness of the first ceramic layer or dielectric substrate 1a. The ground lines formed on the first ceramic layer 1a are also connected to ground terminals included in the right and left lead terminals 2 of the package 1.

As shown in FIG. 3, the first ceramic layer 1a has a top and a bottom edge 11a, as seen in FIG. 1, facing the cavity 3. The top and bottom edges 11a each are slightly set back from the cavity 3 relative to the corresponding edge of the second ceramic layer 1b. Stated another way, the top and bottom edges of the second ceramic layer 1b facing the cavity 3 are slightly protruded in order to form the previously mentioned terraces 11. The ground layer 7 formed on the upper surface of the second ceramic layer 1b is extended to the terraces 11. Discrete circuit components or devices 10, e.g., chip parts constituting bypass capacitors and other adjusting parts are mounted on the portions of the ground layer 7 overlying the terraces 11. The discrete devices 10 are connected to the IC chip 4 and various lines including power supply lines, not shown, formed on the upper surface of the first ceramic layer 1a by the bonding wires 6. The internal arrangement of each discrete device 10 is not shown specifically in FIG. 3.

As stated above, in the illustrative embodiment, the high-speed signal lines 51 and control signal lines 52 each are led out from either the portions 5a and 5c or the portions 5b and 5d of the pattern wiring zone 5 which are separate from each other. In addition, the discrete devices 10 including chip parts for adjustment are allowed to be mounted on the terraces 11 extending out from the second ceramic layer 1b and facing the cavity 3. This is successful to reduce the influence of parasitic impedance ascribable to the lead terminals 2 and wire bonding, compared to the conventional arrangement of discrete devices outside of a package. Further, the ground layer 7 formed on the second ceramic layer 1b and extended to the terraces 11 improves the potential stability of the discrete devices 10 mounted on the terraces 11 and thereby contributes a great deal to the stable operation of the high-frequency IC chip 4 received in the package 1.

Moreover, the discrete devices 10 can be arranged within the package 1, i.e., it is not necessary to connect discrete devices to the outside of the package. It follows that the high-frequency IC package 1 can be mounted even on a circuit board having a limited space.

While the terraces 11 have been shown and described as extending along two of four edges defining the cavity 3 that face each other, only a single terrace may extend along one of the four edges or even along only part of one edge. This alternative arrangement also achieves the above advantages only if the terrace allows discrete parts to be mounted thereon.

Assume that the package 1 is implemented by a laminate of four or more ceramic layers and includes an area or areas for mounting the discrete devices 10 and the ground layer 7 that are formed on different ones of the ceramic layers. Even in such a configuration, the IC chip 4 mounted on the package 1 can stably operate only if a metal layer is formed on the above area or areas and connected to the ground layer 7 by via holes formed in a ceramic layer intervening between the two different ceramic layers.

The illustrative embodiment has concentrated on an IC package hermetically sealed with a ceramic cap covering it. The present invention is capable of reducing the influence of parasitic impedance even when applied to an IC package whose IC chip mounting surface with the above terrace structure is sealed by resin molding.

In summary, it will be seen that the present invention provides an IC package capable of insuring the stable operation of a high-frequency IC circuit and allowing adjusting parts for the IC circuit to be mounted within the package.

While the present invention has been described with reference to the illustrative embodiment, it is not to be restricted by the embodiment. It is to be appreciated that those skilled in the art can change or modify, the embodiment without departing from the scope and spirit of the present invention.

What is claimed is:

1. An IC (Integrated Circuit) package having a package body, the package body comprising:

a first generally flat, electrically insulating layer having a first generally rectangular hole defined by four first edges in a middle of the first insulating layer;

a second generally flat, electrically insulating layer having a second generally rectangular hole defined by four second edges in a middle of the second insulating layer to generally be aligned with the first insulating layer, the second insulating layer having a primary surface on which the first insulating layer is formed; and a third generally flat, electrically insulating layer having a primary surface on which the second insulating layer is formed, the first and second holes defining a cavity in the first and second insulating layers for receiving an IC chip;

a discrete device the second hole being smaller in plan view than the first hole so that at least a portion of the first edges is set back from a corresponding part of the second edges to form a terrace of the second insulating layer, the second insulating layer terrace extending toward the cavity, and mounting the discrete device thereon; and a first and a second electrically conductive pattern being formed within the cavity on a primary surface of the first insulating layer that does not face the primary surface of the second insulating layer;

a generally flat cap hermetically sealing the cavity such that the discrete device, first and second conductive patterns and the first and second insulating layers are within the cavity between the cap and the third insulating layer the first conductive pattern including control signal lines assigned to the IC chip and adjoining at least one of the four first edges;

the second conductive pattern including signal lines other than the control signal lines assigned to the IC chip and adjoining at least one edge among the four first edges not adjoining the control signal lines;

wherein the control signal lines adjoin two of the four first edges opposing each other with respect to the cavity, the signal lines other than the control signal lines adjoining the remaining two of the four first edges.

2. An IC package in accordance with claim 1, wherein two mutually opposing first edges among the four first edges are set back from a corresponding two of the four second edges to form terraces.

3. An IC package in accordance with claim 2, wherein the set back two mutually opposing first edges are the control signal.

4. An IC package in accordance with claim 1, further comprising an electrically conductive layer intervening between the first and second insulating layers and extending to the terrace to form a ground electrode layer.

5. An IC package in accordance with claim 1, the package body further comprising:
a first electrically conductive layer formed on the primary surface of the first insulating layer; and
a second electrically conductive layer formed between the first and second insulating layers;
the first insulating layer having a via hole therethrough in which an electrically conductive member for electrically connecting the first and second conductive layers is received.

6. An IC package in accordance with claim 1, the package body further comprising:
a first electrically conductive layer formed on the primary surface of the second insulating layer; and
a second electrically conductive layer formed between the second and third insulating layers;
the second insulating layer having a via hole therethrough in which an electrically conductive member for electrically connecting the second and third conductive layers are received.

7. An IC package in accordance with claim 1, the package body further comprising an electrically conductive layer provided between the second and third insulating layers to form a bottom of the cavity, the IC chip being mounted on the electrically conductive layer in the cavity.

8. An IC package in accordance with claim 1, wherein the first, second and third insulating layers are formed of a ceramic.

9. An IC package in accordance with claim 1, further comprising a generally flat cap hermetically sealing the cavity.

10. An IC package in accordance with claim 1, wherein the IC chip has a first chip surface resting against the primary surface of the third insulating layer and a second chip surface opposite the first chip surface, the second chip surface generally level with the primary surface of the first insulating layer and an end of the discrete device.

11. An IC (Integrated Circuit) package, comprising:
a first generally flat, electrically insulating layer having a first generally rectangular hole defined by four first edges in a middle of the first insulating layer;
a second generally flat, electrically insulating layer having a second generally rectangular hole defined by four second edges in a middle of the second insulating layer to generally be aligned with the first insulating layer to form a cavity, the second insulating layer having a primary surface on which the first insulating layer is formed; and
a third generally flat, electrically insulating layer having a primary surface on which the second insulating layer is formed;
the second hole being smaller in plan view than the first hole such that two of the four first edges are set back from a corresponding two of the four second edges to form terraces of the second insulating layer, the terraces extending toward the cavity;
a first electrically conductive pattern having control signal lines and a second electrically conductive pattern having other signal lines, the first and second conductive patterns formed on a primary surface of the first insulating layer that does not face the primary surface of the second insulating layer;
a generally flat cap hermetically sealing the cavity, the first and second insulating layers between the cap and the third insulating layer;
a discrete device mounted in the cavity on at least one of the terraces of the second insulating layer; and
an IC chip connected to both the control signal lines and the other signal lines,
wherein the control signal lines adjoin the two set back first edges, and the other signal lines adjoin the remaining two of the first edges, and
wherein the two set back first edges oppose each other with respect to the cavity.

12. An IC package in accordance with claim 11, further comprising an electrically conductive layer intervening between the first and second insulating layers and extending to the terraces to form a ground electrode layer.

13. An IC package in accordance with claim 11, further comprising:
a first electrically conductive layer formed on the primary surface of the first insulating layer; and
a second electrically conductive layer formed between the first and second insulating layers;
the first insulating layer having a via hole therethrough in which an electrically conductive member for electrically connecting the first and second conductive layers is received.

14. An IC package in accordance with claim 11, further comprising:
a first electrically conductive layer formed on the primary surface of the second insulating layer; and
a second electrically conductive layer formed between the second and third insulating layers;
the second insulating layer having a via hole cut in which an electrically conductive member for electrically connecting the second and third conductive layers are received.

15. An IC package in accordance with claim 11, further comprising an electrically conductive layer provided between the second and third insulating layers to form a bottom of the cavity, the IC chip being mounted on the electrically conductive layer in the cavity.

16. An IC package in accordance with claim 11, wherein the first, second and third insulating layers are formed of a ceramic.

17. An IC package in accordance with claim 11, wherein the IC chip has a first chip surface resting against the primary surface of the third insulating layer and a second chip surface opposite the first chip surface, the second chip surface generally level with the primary surface of the first insulating layer and an end of the discrete device.

18. An IC (integrated Circuit) package having a package body, the package body comprising:
- a first generally flat, electrically insulating layer having a first generally rectangular hole defined by four first edges in a middle of the first insulating layer, the first insulating layer having one and only one first layer terrace extending toward the cavity and terminating at the first edges, the first insulating layer having a primary surface that includes the one first layer terrace;
- a second generally flat, electrically insulating layer having a second generally rectangular hole defined by four second edges in a middle of the second insulating layer to generally be aligned with the first insulating layer, the second insulating layer having a primary surface on which the first insulating layer is formed and with which the four first edges abut, the second insulating layer having one and only one second layer terrace, the one second layer terrace extending toward the cavity and terminating at the second edges; and
- a third generally flat, electrically insulating layer having a primary surface on which the second insulating layer is formed and with which the four second edges abut, the first and second holes defining a cavity in the first and second insulating layers for receiving an IC chip;
- a discrete device;
- the second hole being smaller in plan view than the first hole so that at least a portion of the first edges is set back from a corresponding part of the second edges to form the one second layer terrace of the second insulating layer extending from the first edges toward the cavity, and on which the discrete device is mounted; and
- a first electrically conductive pattern including control signal lines assigned to the IC chip and adjoining at least one of the four first edges edge and a second electrically conductive pattern including other signal lines assigned to the IC chip and adjoining at least one edge among the four first edges not adjoining the control signal lines, the first and second electrically conductive patterns formed on a primary surface of the first insulating layer that does not face the primary surface of the second insulating layer.

19. An IC package in accordance with claim 18, wherein the IC chip has a first chip surface resting against the primary surface of the third insulating layer and a second chip surface opposite the first chip surface, the second chip surface generally level with the primary surface of the first insulating layer and an end of the discrete device.

20. An IC package in accordance with claim 18, further comprising a generally flat cap hermetically sealing the cavity such that the first and second electrically conductive patterns and the first and second insulating layers are within the cavity between the cap and third insulating layer, the cap extending over the second chip surface in spaced relation thereto.

* * * * *